(12) United States Patent
Miller

(10) Patent No.: US 6,617,526 B2
(45) Date of Patent: Sep. 9, 2003

(54) UHF GROUND INTERCONNECTS

(75) Inventor: Peter A. Miller, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/839,151

(22) Filed: Apr. 23, 2001

(65) Prior Publication Data

US 2002/0153167 A1 Oct. 24, 2002

(51) Int. Cl.⁷ .............................. H01R 12/04; H05K 1/11
(52) U.S. Cl. ........................ 174/261; 174/255; 174/262; 174/266; 361/792; 361/794; 361/795
(58) Field of Search ..................... 174/261, 262, 174/266, 263, 264, 255; 361/792, 793, 794, 795, 735, 790, 803; 439/65; 257/698

(56) References Cited

U.S. PATENT DOCUMENTS

| | | | |
|---|---|---|---|
| 3,739,469 A | 6/1973 | Dougherty, Jr. | |
| 4,170,819 A | * 10/1979 | Peter et al. | 174/254 |
| 4,211,603 A | * 7/1980 | Reed | 174/266 |
| 4,675,788 A | * 6/1987 | Breitling et al. | 174/265 |
| 4,679,872 A | 7/1987 | Coe | |
| 5,057,809 A | 10/1991 | Chandler et al. | |
| 5,225,969 A | 7/1993 | Takaya et al. | |
| 5,374,788 A | * 12/1994 | Endoh et al. | 174/255 |
| 5,376,759 A | 12/1994 | Marx et al. | |
| 5,421,083 A | * 6/1995 | Suppelsa et al. | 174/250 |
| 5,459,642 A | 10/1995 | Stoddard | |
| 5,565,262 A | * 10/1996 | Azzaro et al. | 174/256 |
| 5,612,660 A | 3/1997 | Takimoto | |
| 5,808,529 A | 9/1998 | Hamre | |
| 5,823,795 A | 10/1998 | Schumacher | |
| 5,847,451 A | 12/1998 | Ohtaki et al. | |
| 5,853,303 A | 12/1998 | Brunker et al. | |
| 5,876,842 A | * 3/1999 | Duffy et al. | 174/250 |
| 5,921,815 A | 7/1999 | Brunker et al. | |
| 5,949,030 A | * 9/1999 | Fasano et al. | 174/262 |
| 6,019,639 A | 2/2000 | Brunker et al. | |
| 6,228,511 B1 | * 5/2001 | Sachdev et al. | 174/261 |

FOREIGN PATENT DOCUMENTS

| | | | |
|---|---|---|---|
| JP | 402094693 A | * | 4/1990 |
| JP | 02001053397 A | * | 2/2001 |
| JP | 404062894 A | * | 2/2002 |

* cited by examiner

Primary Examiner—Kamand Cuneo
Assistant Examiner—I B Patel
(74) Attorney, Agent, or Firm—Burns, Doane, Swecker & Mathis, LLP

(57) ABSTRACT

A via on a printed circuit board having a circuit has a first interconnect and a second interconnect located about at least a portion of the first interconnect. The second interconnect connects to ground of the circuit and is coaxial and substantially concentric with the first interconnect and inductively coupled with the first interconnect. A method of electrically interconnecting at a via multiple layers on a printed circuit board to provide a common ground plane for a circuit is also provided. A high speed interconnection can be attained by allowing the ground return path for a circuit carried on multiple layers of a multilayer printed circuit board to remain coupled to the signal, thereby lowering ground inductance and maintaining signal integrity, even at UHF, while minimizing costs.

10 Claims, 2 Drawing Sheets

UHF GROUND INTERCONNECTS

BACKGROUND

1. Field of the Invention

The present device is directed generally to printed circuit boards. More specifically, the present invention is directed to interconnecting two or more signal layers of a multilayer printed circuit board while maintaining a well coupled signal return path to reduce signal noise.

2. Background of the Invention

Ground inductance is an industry-recognized source of ground bounce or noise. In the presence of parasitic capacitance, the ground circuit can even resonate causing extraordinary ground noise to be developed, with this effect being proportional to frequency.

Known methods are directed to minimizing ground inductance and limiting noise. Examples of various techniques may be found in U.S. Pat. No. 4,679,872, issued to Coe, and U.S. Pat. No. 5,808,529, issued to Hamre. U.S. Pat. No. 3,739,469, issued to Dougherty, Jr., the disclosure of which is hereby incorporated by reference, discloses the fabrication of a multilayered printed circuit board in which concentric through-holes (via holes) extend between layers to provide a higher density of via holes in the board. However, with increased frequencies, existing ground interconnect methods have proven inadequate and exhibit relatively high inductance. Known methods do not adequately address the need for coupling of the ground planes in a printed circuit board so as to minimize ground inductance, especially at high frequencies, such as at system clock frequencies on the order of 500 MHz or greater, or at direct frequencies on the order of 1 GHz or greater. Additionally, prior practices have become increasingly expensive and ineffective, mostly because of the incomplete coupling of the signal to the ground return path.

For example, consider a simple printed circuit board having a layer with a signal net that runs from one location on the board to another location on the board. On an adjacent layer to the signal net is a ground plane. As a signal current propagates down the signal net to its load on the board, the ground current returns to the driver on a ground plane. In DC, the ground current flows through the ground plane, spreading out over the board and taking the lowest ohmic path back to the driver. However, for an AC signal, under the transmission line principle, as the frequencies increase the ground current is channeled to flow in the shadow of the signal current. As a result, even though there is a choice of many different paths where the ground current may spread out, the AC return current is induced to concentrate in the shadow of the signal current.

Signal quality deteriorates whenever the ground return path is interrupted. In a coaxial cable, if a break in the shield existed, the break would radiate. In a printed circuit board, if there is a gap in a single ground plane (such as a crack or a via or a split of the plane into separate analog and digital planes), a high frequency signal crossing the gap would have its induced ground return current interrupted. The ground return current cannot flow in the shadow of the signal. The current would still return, but is forced to take an alternative and often circuitous route, forcing the ground return current to be separated from the signal current.

For example, a multilayered printed circuit board may have two or more ground planes and a signal current may have to be routed on more than one layer. When there are two or more ground planes on the board, it is advantageous to interconnect the ground planes so as not to interrupt the ability of the return current to remain in the shadow of the signal current. Conceptually, the ground plane is interconnected every time a through-hole technology part is installed on a board. For example, a DIP-type part can be inserted in a through-hole in the board and join together the ground planes at that location. Multiple parts placed into holes can result in a "stitching together" of the ground planes. However, this approach can result in the ground interconnections being separated from the signal vias.

The physical separation of the ground vias from the signal via can result in a radiation problem manifest in reduced AC signal quality. The transmission line properties can deteriorate such that cross-talking can occur and the ground can become noisy.

SUMMARY OF THE INVENTION

Exemplary embodiments of the present invention are directed to providing a signal net on a printed circuit board, such as boards having multiple ground plane, wherein a return current ground path remains coupled to the signal path.

In accordance with exemplary embodiments, a via on a printed circuit board having a circuit has a first interconnect and a second interconnect located about at least a portion of the first interconnect. The second interconnect connects to ground of the circuit and is coaxial and substantially concentric with the first interconnect and inductively coupled with the first interconnect.

A method of electrically interconnecting multiple layers on a printed circuit board to provide a continuous ground circuit for a signal is provided. The method connects a first layer and at least a second layer to a via disposed in a through-hole of a printed circuit board. The via has a first interconnect and a second interconnect located about at least a portion of the first interconnect, the second interconnect being coaxial and substantially concentric with the first interconnect and inductively coupled. The second interconnect is connected to ground of the circuit.

Exemplary embodiments connect the grounds from one printed circuit layer to another printed circuit layer, can reduce ground inductance in electrical circuits, and provide coupling that quiets the ground, even at UHF, while minimizing cost. The layers to be interconnected can be located in a single printed circuit board or in a monolithically integrated set of two or more printed circuit boards. Exemplary embodiments can attain a high speed interconnection by allowing the ground return path for a circuit carried on multiple layers of a multilayer printed circuit board to remain coupled to the signal, thereby lowering the ground inductance and maintaining the signal integrity.

BRIEF DESCRIPTION OF THE DRAWING FIGURES

Other objects and advantages of the invention will become apparent from the following detailed description of preferred embodiments in connection with the accompanying drawings in which like numerals designate like elements and in which.

DETAILED DESCRIPTION OF THE PREFERRED EMBODIMENTS

Figure 1:
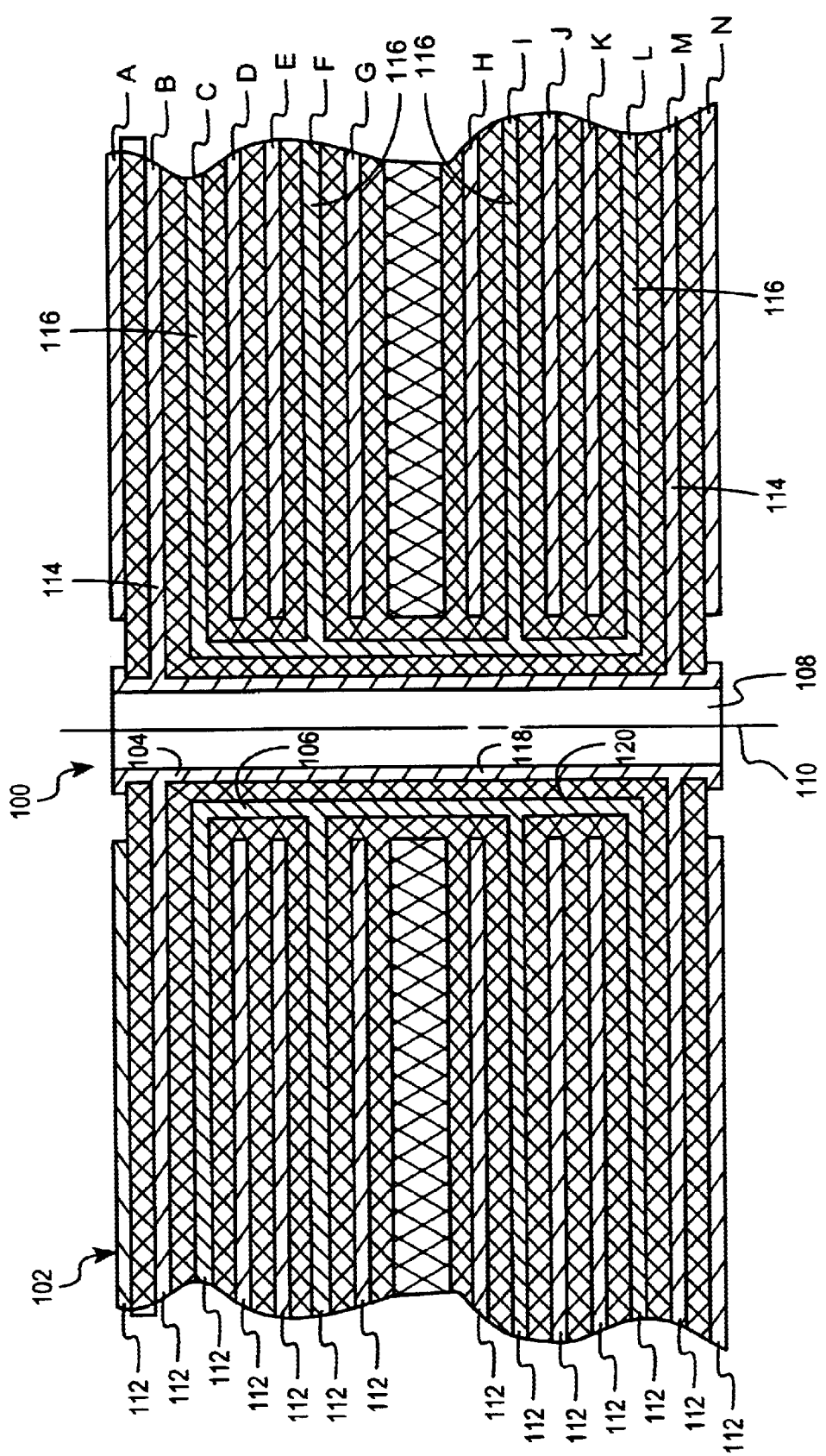
FIG. 1 is a cross-sectional schematic of an embodiment of a coaxially arranged interconnect.

FIG. 1 shows an exemplary embodiment of a via 100 in a printed circuit board 102 having a circuit. In the FIG. 1 embodiment, the via 100 is shown to include a first interconnect 104 and a second interconnect 106 located about at least a portion of the first interconnect 104. The second interconnect 106 is substantially coaxial with the first interconnect 104 and the second interconnect 106 is connected to ground of the circuit. Those skilled in the art will appreciate that although two interconnects 104, 106 are shown, any number of interconnects can be used. The interconnects and layers of the printed circuit board can be formed of the same or different material (that is, of any conductive or semiconductive material including, but not limited to, aluminum, copper, and so forth).

The first interconnect 104 and second interconnect 106 of the via 100 can take the form of concentric cylinders disposed in a single via hole 108 on the printed circuit board 102. Alternatively, the interconnects 104, 106 can have other shapes such as ovals, squares, or any other shape that can be substantially concentric or positioned around a common axis 110 of a through-hole. As referenced herein, "substantially concentric" interconnects refer to at least one interconnect that is essentially circumscribed by another interconnect without directly contacting the other interconnect, such that the two interconnects would be inductively coupled.

In the exemplary FIG. 1 embodiment, a first interconnect 104 provides a circuit connecting electrical elements of a printed circuit board 102 and a second interconnect 106 provides a ground circuit connecting the ground planes of the printed circuit board. More particularly, the interconnects of FIG. 1 include a first interconnect 104 represented as an inner concentric cylinder, and a second interconnect 106 represented as an outer concentric cylinder. The second interconnect 106 is operatively connected to at least two layers 112 of the printed circuit board 102. As shown in FIG. 1, the first interconnect 104 (the inner concentric cylinder) intersects and is operatively communicative with two layers B, M of the multilayer printed circuit board 102 and the second interconnect 106 (the outer concentric cylinder) intersects and is operatively communicative to at least two layers (for example, the four layers C, F, I, and L) of the multilayer printed circuit board 102. Those skilled in the art will appreciate that although two layers of the multilayer printed circuit board are shown, any number of layers of a multilayer printed circuit board can be used, the layers to be connected to the second interconnect constituting a ground plane.

The signal net 114 can be on any one or more of the layers 112 of the printed circuit board 102, and any or all of the signal net 114 can be used to carry the signal current at any given time. Likewise, any one or more of the layers 112 of the printed circuit board 102 can be used as the ground plane 116. Of the available layers 112, the ground plane 116 is predisposed by the transmission line principle to be on the layer 112 of the circuit board 102 closest to the signal net 114. For example, as shown in exemplary embodiment FIG. 1, the signal net 114 is represented to be carried on layers B and M and the layers C and L are the corresponding ground planes 116.

At the via 100, the layers 112 carrying signal nets 114 and the ground planes 116 can intersect with the electrical interconnects 104, 106. In the embodiment shown in FIG. 1, layers B and M carry the signal net 114 and intersect the inner concentric cylinder, thus forming a continuous electrical path interconnecting the signal nets 114 on multiple layers 112. For purposes of this description, this interconnect is termed the signal interconnect 118. Likewise, layers C, F, I, and L can carry the ground plane 116, but by the transmission line principle, the ground plane 116 is induced in layers C and L. Layers C and L intersect the outer concentric cylinder, thus forming a continuous electrical path interconnecting ground planes 116 on multiple layers 112. For purposes of this description, this interconnect is termed the ground interconnect 120.

In alternative embodiments with multiple concentric electrical interconnects at the via 100, the signal net 114 can intersect the second interconnect 106 and the ground planes 116 can intersect the first electrical interconnect 104.

A printed circuit board 102 with multiple layers 112 can be a single printed circuit board or can be a monolithically integrated set of two or more printed circuit boards. The printed circuit board 102 can have the signal net 114 and the ground plane 116 on any combination of layers 112 of the printed circuit board 102 and the signal interconnect 118 and ground interconnect 120 of the via 100 intersect the layers 112 of the printed circuit board 102 carrying the signal net 114 and ground plane 116, respectively.

Multiple intersections of the ground interconnection 120 to the layers available to carry the ground planes 116 does not necessarily require that all of the ground planes 116 be utilized by the ground current. For example, FIG. 1 shows additional layers F and I intersecting the ground interconnect 120 and that may carry induced ground planes 116. However, there will be no ground current induced on layer F because, by the transmission line principle, there is no signal current carried on the adjacent associated signal net 114 (e.g. layer E or G). Thus, the interconnects 104, 106 of the via 100 of the present invention can afford the circuit designer greater flexibility in the design and placement of electrical features by interconnecting the layers that are available to carry the induced ground planes 116, whether electrically utilized or not.

Figure 2:
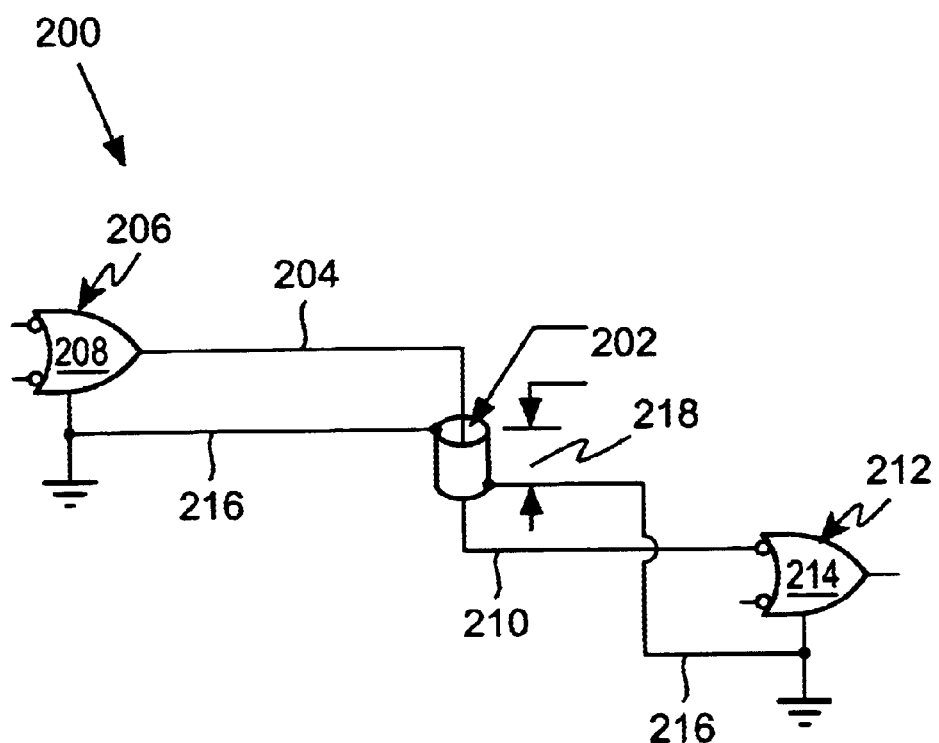
FIG. 2 is an electrical circuit of an embodiment of a coaxially arranged interconnect.

FIG. 2 is an exemplary electrical circuit 200 which includes the via 202 shown in FIG. 1. The via 202 interconnects the signal current output 204 of a first element 206, such as a gate 208, and the signal current input 210 of a second element 212, such as a gate 214. The signal current input 210 and signal current output 204 can be carried on, for example, the signal net 114 of FIG. 1. The ground planes 216 of the first element 206 and the second element 212 are interconnected through, for example, the ground interconnect 120 of FIG. 1, thereby creating a common ground plane 216. The ground planes 216 of the first element 206 and the second element 212 can be pre-disposed to be on, for example, the layers adjacent the signal net 114 of FIG. 1 (e.g., C and L). By this arrangement, the ground plane 216 is continuously coupled to the signal current with attendant reduction in electrical properties, such as ground inductance. For purposes of the series ground inductance as present in the ground current, the inductance is essentially canceled and the voltage drop 218 will approach zero. These results can be achieved over a broad frequency range including, but not limited to, system clock frequencies on the order of 500 MHz or greater, and/or direct frequencies on the order of 1 GHz or greater.

Electrically, the signal current and the ground current can, in exemplary embodiments, be routed as close as possible to provide the electrical coupling. For example, in FIG. 1 where the interconnects 104, 106 are concentric cylinders, coupling of the signal current to the ground current results from the coaxial relationship in the coaxial via, with coupling approaching 100 percent.

Similar to a coaxial cable where a signal current and a ground plane are well-coupled, the coupling of the signal current on the signal net and the ground plane can establish equal and opposite current from which the radiation crosstalk effects substantially cancel. A voltage drop in the shield is generally not observed, even though it is conducting a lot of current, because the inductance effect of the signal and its ground are canceled by being well coupled.

A method of electrically interconnecting ground planes 116 connects a first layer of a multilayer printed circuit board 102 and at least a second layer of a multilayer printed circuit board 102 to a via 100 disposed in a through-hole 108 of a printed circuit board 102. The via 100 has two interconnects arranged substantially coaxially in a single through-hole 108. The first layer is electrically connected to the inner interconnect 104 and carries the signal net 114. Layers 112 of the printed circuit board are electrically connected to the outer interconnect 106 and are available to carry the induced current on the ground plane 116. The method of electrically interconnecting ground planes 116 and signal nets 114 results in coupling of the signal and ground currents, with coupling approaching 100 percent.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed is:

1. A via for use in a multilayer printed circuit board having a circuit, the printed circuit board including a first plurality of conductive layers and a second plurality of conductive layers, the first and second plurality of conductive layers being interleaved in a first direction which extends parallel to an axis of the via, the via comprising:

a first interconnect located about the axis of the via and electrically connecting the first plurality of interleaved conductive layers to a signal net of the circuit; and a second interconnect having a portion located about the first interconnect for electrically connecting the second plurality of interleaved conductive layers to a ground plane of the circuit, wherein the second interconnect is coaxial with the first interconnect and is inductively coupled with the first interconnect.

2. The via of claim 1, wherein the first and second interconnects are substantially concentric.

3. The via of claim 2, wherein the first and second interconnects are cylinders in a single via hole.

4. The via of claim 1, wherein the first plurality of conductive layers and the second plurality of conductive layers are located in a single printed circuit board.

5. The via of claim 1, wherein the first plurality of conductive layers and the second plurality of conductive layers are located in a monolithically integrated set of two or more printed circuit boards.

6. A printed circuit board comprising:

a plurality of vias according to claim 1.

7. The via of claim 1, wherein the via has a length in the first direction from a first surface of the multilayer printed circuit board to a second surface of the multilayer printed circuit board, and wherein the first interconnect has a length that is coextensive in length with the via.

8. The via of claim 7, wherein the second interconnect has a length that is no more than the length of the first interconnect, the second interconnect parallel to the first interconnect along an entire length of the second interconnect.

9. The via of claim 8, wherein the entire length of the second interconnect is in one plane.

10. A multilayer printed circuit board having a circuit, the multilayer circuit board comprising:

a first plurality of conductive layers;

a second plurality of conductive layers, the first and second plurality of conductive layers being interleaved in a first direction which extends parallel to an axis of the via; and a via including a first interconnect, the first interconnect located about the axis of the via and electrically connecting the first plurality of interleaved conductive layers to a signal net of the circuit, and a second interconnect, the second interconnect located about at least a portion of the first interconnect and electrically connecting the second plurality of interleaved conductive layers to a ground plane of the circuit, wherein the second interconnect is coaxial with the first interconnect along its length in the first direction and is inductively coupled with the first interconnect.

* * * * *